United States Patent [19]

Yamashita et al.

[11] Patent Number: 5,113,108
[45] Date of Patent: May 12, 1992

[54] HERMETICALLY SEALED ELECTROSTRICTIVE ACTUATOR

[75] Inventors: Osamu Yamashita; Eiji Takahashi; Takeshi Nishizawa; Hidekazu Takada; Tetsuo Shirasu, all of Tokyo, Japan

[73] Assignee: NEC Corporation, Tokyo, Japan

[21] Appl. No.: 432,809

[22] Filed: Nov. 6, 1989

[30] Foreign Application Priority Data

| Nov. 4, 1988 | [JP] | Japan | 63-279741 |
| Nov. 4, 1988 | [JP] | Japan | 63-279772 |
| Nov. 15, 1988 | [JP] | Japan | 63-149158[U] |
| Nov. 17, 1988 | [JP] | Japan | 63-150230[U] |
| Nov. 17, 1988 | [JP] | Japan | 63-291322[U] |

[51] Int. Cl.$^5$ .............................. H01L 41/08
[52] U.S. Cl. .................. 310/328; 310/340; 310/346
[58] Field of Search ............... 310/323, 328, 346, 340

[56] References Cited

U.S. PATENT DOCUMENTS

| 3,390,287 | 6/1968 | Sonderegger | 310/346 X |
| 3,482,121 | 12/1969 | Hatschek | 310/346 X |
| 3,496,102 | 2/1970 | List et al. | 310/346 X |
| 4,011,474 | 3/1977 | O'Neill | 310/328 |
| 4,406,966 | 9/1983 | Paros | 310/346 X |
| 4,460,842 | 7/1984 | Waanders et al. | 310/328 X |
| 4,553,059 | 11/1985 | Abe et al. | 310/328 X |
| 4,577,131 | 3/1986 | Soobitsky | 310/328 |
| 4,814,659 | 3/1989 | Sawada | 310/328 |

FOREIGN PATENT DOCUMENTS

| 409790 | 12/1945 | Italy | 310/328 |
| 60-19968 | 2/1985 | Japan | 310/328 |
| 60-39879 | 3/1985 | Japan | 310/328 |
| 2087659 | 5/1982 | United Kingdom | 310/328 |
| 2193386 | 2/1988 | United Kingdom | 310/328 |

Primary Examiner—Mark O. Budd
Attorney, Agent, or Firm—Laff, Whitesel Conte & Saret

[57] ABSTRACT

A hermetically sealed electrostrictive actuator comprises a metal case and a metal cap for housing an electrostrictive element therein. The metal cap is provided with a pair of glass sealing terminals to be connected to a pair of lead wires of the electrostrictive element. The metal case is provided a flexible region so as to follow the expansion and constraction of the electrostrictive element without breaking the hermetic envelope of the metal case and the metal cap.

7 Claims, 8 Drawing Sheets

HERMETICALLY SEALED ELECTROSTRICTIVE ACTUATOR

BACKGROUND OF THE INVENTION

The present invention relates to a piezoelectric actuator, and more particularly to a hermetical sealing structure for an electrostrictive element.

Recently, piezoelectric actuators have become extremely promising mechanical driving elements as precision positioning devices for optical or magnetic disk heads, various kinds of optical devices, precision machine tools and the like. Since the mechanical displacement due to the piezoelectric effect is essentially extremely minute, a plurality of electrostrictive ceramic layers or piezoelectric ceramic layers are stacked with internal electrodes as disclosed in the U.S. Pat. No. 4,681,667 issued on a Jul. 21, 1987. The mechanical displacement may be further increased by using a mechanical amplification mechanism as is disclosed in the U.S. Pat. No. 4,570,095 issued on Feb. 11, 1986.

In a conventional electrostrictive element using silver based internal electrodes, migration easily takes place at exposed ends of the internal electrodes in a humid atmosphere, and thus causing a poor insulation characteristics. When a humidity test is given, there occur numerous cases of discharge generation from the side surface or the corner parts, creating a substantial obstacle to the yield and the reliability of the products.

SUMMARY OF THE INVENTION

It is, therefore, an object of the present invention to provide an actuator with excellent moisture resistance.

According to the present invention, a hermetically sealed electrostrictive actuator comprises a flexible metal envelope containing an electrostrictive element therein. The metal envelope consists of a metal case and a metal cap air-tightly sealed to each other. The metal cap is provided with a pair of glass sealing terminals connected to a pair of lead wires of the electrostrictive element. The metal case is provided with a flexible region such as bellows and corrugated portion so as to follow the expansion and contraction of the electrostrictive element without breaking the air-tightness of the metal envelope.

DETAILED DESCRIPTION OF THE PREFERRED EMBODIMENTS

Figure 1:
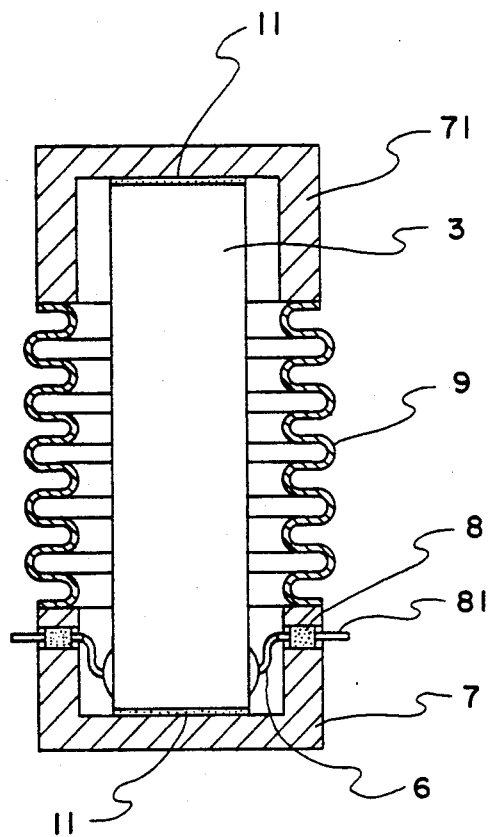
FIG. 1 is a vertical sectional view showing a first embodiment of the present invention.

Referring to FIG. 1, a circular stainless steel metallic member 7 with U-shaped sectional area equipped with a pair of lead terminals 81 is fixed to one end of an electrostrictive element 3. The lead terminals 8 penetrate through each of a glass sealing terminal 8 connected with a lead wire 6 to an external electrode conductor of the electrostrictive element 3. A circular strainless steel metallic member 71 with U-shaped sectional area is fixed to the other end of the electrostrictive element 3. Both ends of a stainless steel cylindrical bellows 9 with inner diameter greater than the other diameter of the electrostrictive element 3 and equal to the inner diameter of the metallic members 7 and 71 are fixed to the metallic members 7 and 71 so as to hermetically seal the electrostrictive element 3.

Next, the method of manufacture of the electrostrictive actuator of the present invention will be described.

First, a laminated body is prepared by forming a green sheet with thickness of about 100 μm by mixing an organic binder to multicomponent solid solution ceramic powder having perouskite crystal structure, coating it with a pastelike silver internal electrode conductor layer, and after drying, laminating it into tens of layers (64 layers, for example) and sintering. Since the end portions of the silver internal electrode conductor layers are exposed to the side surface of the laminated body, external electrode conductors are formed after selectively covering the end portions with an insulating glass film, and two comb-line electrodes are formed by alternately connecting every other layer of the silver internal electrode conductor layers. Then, lead wires are connected to the external electrode conductors by soldering, and the side surface alone is coated with a resin. The metallic members 7 and 71 and the bellows 9 are attached to the electrostrictive element 3, and the system is given a hermetic sealing treatment. Namely, the electrostrictive element 3 is fixed stand erect with an adhesive layer 11 to the inside bottom surface of the metallic member 7 with two lead terminals 8 attached thereto. Next, the lead wire 6 of the electrostrictive element 3 and the inner end of the lead terminal 81 attached to the metallic member 7 are connected by soldering. Then, the bellows 9 is attached from above so as to enclose the electrostrictive element 3, and the other metallic member 71 is fixed with adhesive layer 11 to the top end part of the electrostrictive element 3 so as to cover the element. It is to be noted here that the spring constant of the bellows 9 in the direction of expansion and contraction is preferable to be less than one tenth of the generated force of the electrostrictive element. Then, the hermetic sealing is completed by welding both ends of the bellows 9 to the respective metallic members 71 and along the entire circumference of each member by electric arc welding.

Figure 2:
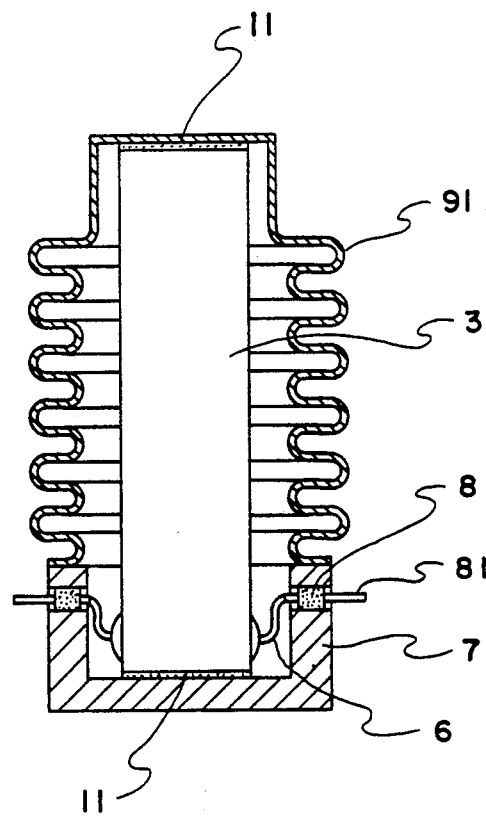
FIG. 2 is a vertical sectional view showing a second embodiment of the present invention.

FIG. 2 is a vertical sectional view of a second embodiment of the electrostrictive actuator of the present invention. In this embodiment, the bellows 9 and the upper metallic member 71 is replaced by a bottomed bellows 91 with its one end (top part in the drawing) blocked. The bottom of the bellows 91 is bonded to the top face of the electrostrictive element 3 with the adhesive layer 11.

The present embodiment has an advantage in that the first embodiment because of the deletion of the upper metallic member 71.

It should be noted that although the case of employing electric arc welding as the method for hermetically sealing the bellows 9 and 91 with the metallic members 7 and 71, respectively, in the first and the second embodiments, similar effect can also be obtained by adopting other methods such as brazing, glass sealing and adhesion with resin.

As described in the above, the present invention has an effect of positively preventing the infiltration of moisture from ambient air and enhancing the reliability of the device markedly by enclosing an electrostrictive element within a hermetically sealed container consisting of a bellows and metallic members.

Figure 3:
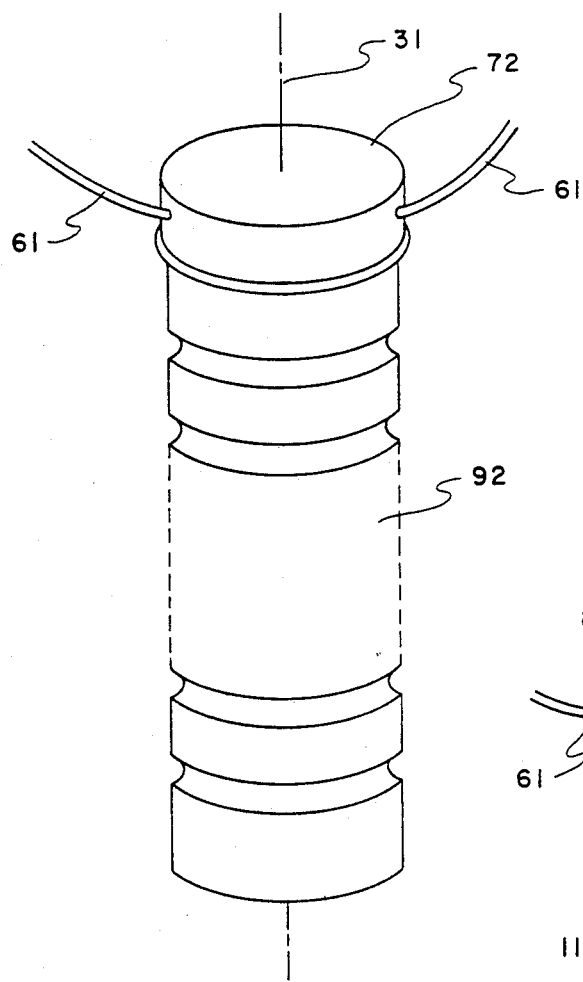
FIG. 3 is a perspective view showing a third embodiment of the present invention.
Figure 4:
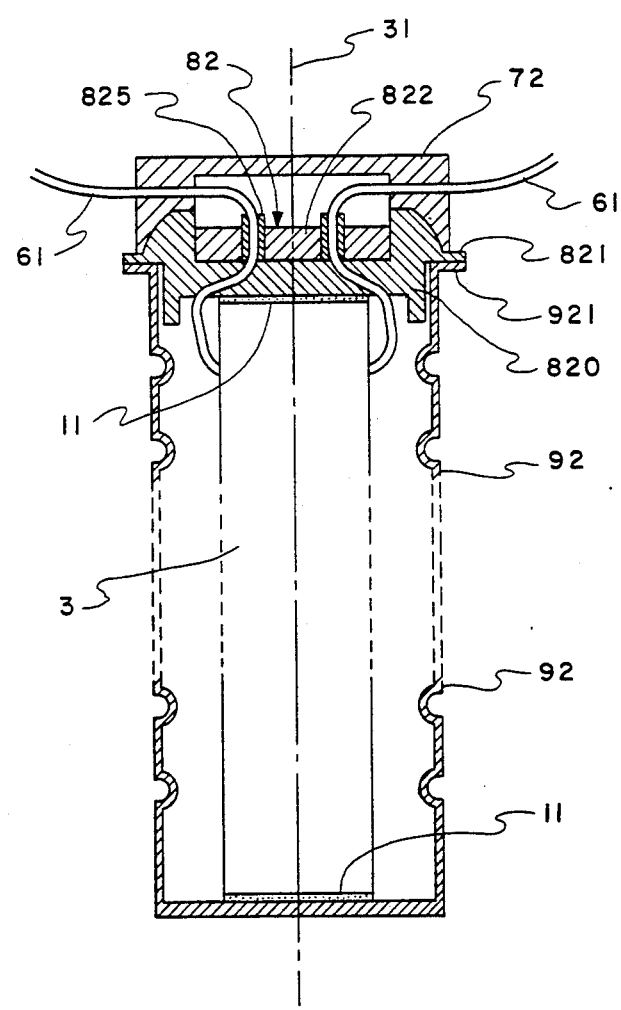
FIG. 4 is a vertical sectional view of the third embodiment shown in FIG. 3.

Next, referring to FIG. 3 and FIG. 4, a third embodiment of the present embodiment will be described. The electrostrictive element 3 is held in a hermetically sealed condition by the use of a metallic case 92 and an airtight terminal 82 provided on one end face of the electrostrictive element 3. A caplike metallic member 72 is placed covering the airtight terminal 82, and lead wires 61 are taken outside piercing through the metallic member 72 after they are pierced through the airtight terminals 82 substantially parallel to an electrostrictive effect generating axis 31.

Next, the assembly of the actuator will be described.

The metallic case 92 is fixed with the adhesive layer 11 to the bottom surface of the electrostrictive element 3. The airtight terminal 82 consists of a metal portion 820 and insulative portion 822. The metal portion 820 is fixed to the top surface of the element 3 with the adhesive layer 11. A flange 821 of the metal portion 820 and a flange 921 of the metallic case 92 are sealed to each other by welding. The lead wires 61 are coated with insulative material such as teflon. The take-out ports of the lead wires 61 of the insulative portion 822 are sealed with a soldering material 825 after removing the insulative material of the lead wires 61. Then, the caplike metallic member 72 which bends the lead wires 61, that are taken out in parallel to the electrostrictive effect generating axis 31 via the airtight terminal 82, orthogonally to the axis 31 is fixed with an adhesive or by soldering.

Figure 5:
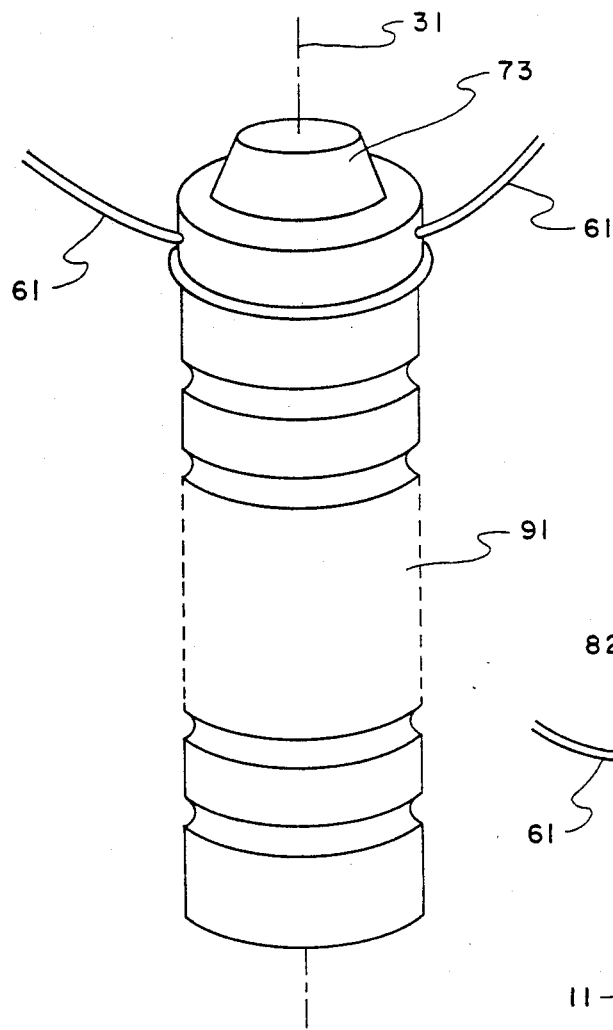
FIG. 5 is a perspective view showing a fourth embodiment of the present invention.
Figure 6:
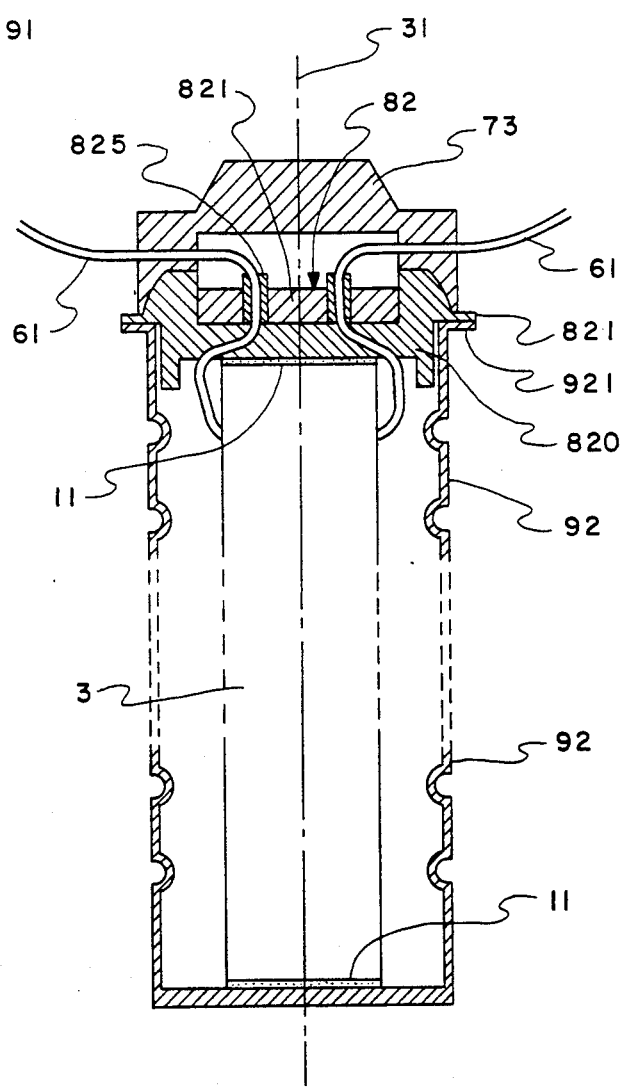
FIG. 6 is a vertical sectional view of the fourth embodiment shown in FIG. 5.

Referring to FIG. 5 and FIG. 6, a fourth embodiment of the actuator of the present invention will be described. In this embodiment, a metallic member 73 is used. The metallic member 73 has a base surface that is not flat but is provided with a simply structured projection having a tapered part at its center. With the provision of such a projection there is obtained an advantage that the positioning of the actuator element can be facilitated.

As described in the above, in the third and the fourth embodiments, the lead wires that are taken out from either one of the end parts of the element in parallel to the electrostrictive effect generating axis are bent perpendicularly to the electrostrictive effect generating axis, and a caplike metallic member 73 is fixed to the actuator as a means for external mounting. By so arranging, the following effects can be realized.

(1) In mounting the actuator to a certain product, the surface form for mounting the actuator can be simplified.

(2) It becomes possible to transmit a stress generated in the actuator by means of the totality of the stress generating surface.

Next, referring to FIG. 7 to FIG. 9, a fifth embodiment of the present invention will be described.

This electrostrictive element 3 is located within a metallic case 93 which has a corrugated part 931 so as to be able to expand and contract in the direction of the electrostrictive element 3. A platelike metallic stem 74 is fixed to the other end of the electrostrictive element 3 with the adhesive layer 11. The metallic stem 74 is provided with external terminals 83 and 84 that are electrically connected to the external electrode conductors of the electrostrictive element 3 via lead wires 63 and 64 and hermetically sealed by hermetically sealing parts 831 and 841. The metallic stem 74 is welded with the metallic case 93 at a contact portion 932.

Next, the method of manufacturing the electrostrictive actuator of the present embodiment will be described.

First, a small amount of an organic binder is added to prebaked powder of electrostrictive material having lead nickel niobate Pb (Ni $\frac{1}{3}$ Nb $\frac{2}{3}$) or lead titanate $PbTiO_3$, for example, as main components, a slurry is prepared by dispersing the above mixture into an organic solvent, and an electrostrictive ceramic member 1 with thickness of about 10 μm is formed by slip casting filming method or the like with the slurry. Next, an internal electrode conductor 2 is formed by depositing a conductive paste having a mixed powder of silver powder and palladium powder in the weight ratio of 7:3 on one side of the electrostrictive ceramic member 1 to a thickness of about 10 μm by screen printing or the like. After forming a laminated body by laminating a plurality of layers of internal electrode conductors, and sintering it at about 1100° C. for two hours, and a prismatic laminated sintered body as the electrostrictive element 3 is formed. The end faces of the internal electrodes $2_1$ to $2_{n-1}$ are exposed to the outside by cutting the side surface of the laminated sintered body. Next, insulating layers $4_n$ to $4_{n-1}$ are formed by alternately applying glass powder and giving sintering process to the end parts of the internal electrode conductors $2_1$ to $2_{n-1}$ on a pair of opposed side faces of the laminated sintered body by electrophoretic method. Subsequently, a pair of external electrode conductors 51 and 52 are formed by applying a conductive paste that contains silver powder as the principal component, in order to connect every other one of the internal electrode conductors $2_1$ to $2_{n-1}$, and by sintering the product. Further, lead wires electrically connected to the external electrode conductors 51 and 52 are installed. Next, a metal such as stainless steel, phosphor bronze, german silver, monel metal, beryllium copper, brass, nickel, inconel, 17-7PH, nickel sprun C and aluminum is cold rolled into a cylinder closed on one end. Then, a corrugated part 931 is formed in a part of the cylinder by hydraulic push-in method or the like. The laminated sintered body is then surrounded by the flexible metallic case 93 and a disklike metallic stem 74 made of the same material as that of the metallic case 93 and having a pair of hermetically sealed external terminals 83 and 84 made of an iron alloy, cobalt alloy, nickel or the like. Then, the top and bottom faces of the electrostrictive element 3 are fixed to the bottom part of the metallic case 93 and to one side of the metallic stem 74 via an adhesive 11 such as epoxy resin. Finally, the manufacture is completed by sealing the contact part 932 of the metallic stem 74 and the metallic case 93 by laser beam welding method, electrobeam welding method, resistance welding method, Tig welding method or the like in the vacuum, dry air, or inert gas.

Figure 10:
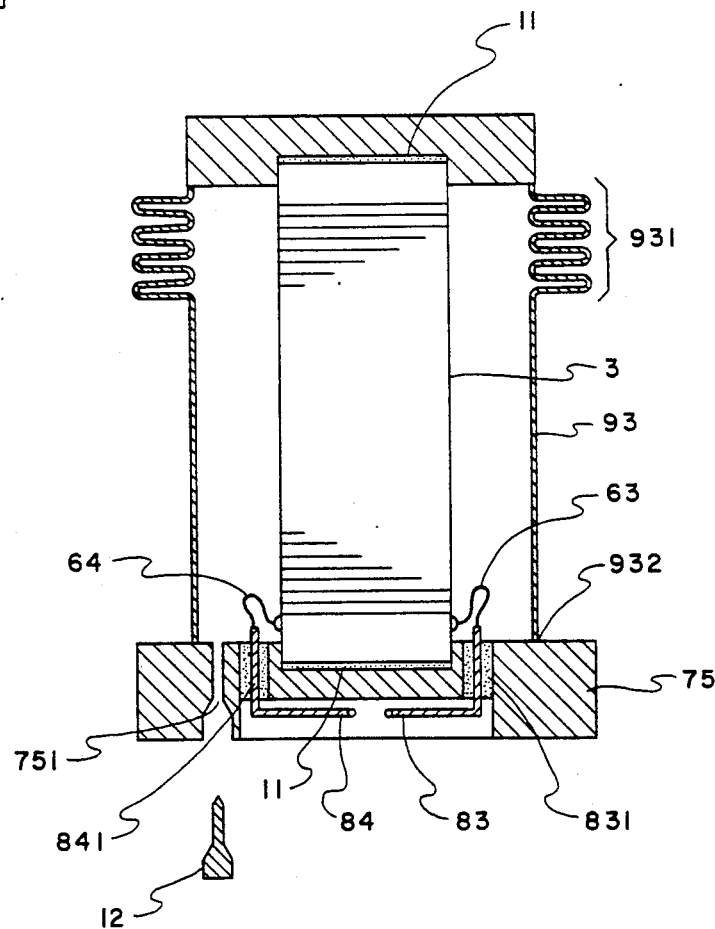
FIG. 10 is a vertical sectional view showing a sixth embodiment of the present invention.

FIG. 10 is a vertical sectional view of a sixth embodiment of the hearmitically sealed electrostrictive actuator of the present invention.

The present embodiment can be obtained by providing a hole 751 that communicates the interior of the metallic case 93 with the outside in the metallic stem 75 in the fifth embodiment, and a rivet 12 that blocks the hole 751.

Next, the method for manufacture the present embodiment will be described.

Up to the step of sealing, by welding, of the contact part 932 of the metallic stem 75 and the metallic case 93 by means of laser beam welding method, electrobeam welding method or the like, it is the same as in the fifth embodiment. Next, moisture and the gaseous components that remain within the metallic case 93 are expelled through the hole part 751 provided in the metallic stem 75 by heating the system in the vacuum environment at 150° C. for about one hour. Finally, after injecting an inert gas such as dry air, $N_2$, Ar or the like to substantially atmospheric pressure, a metallic rivet 12 made of a copper alloy, aluminum or the like is driven in or screwed in, and the system is completely sealed by soldering it from above.

Figure 11:
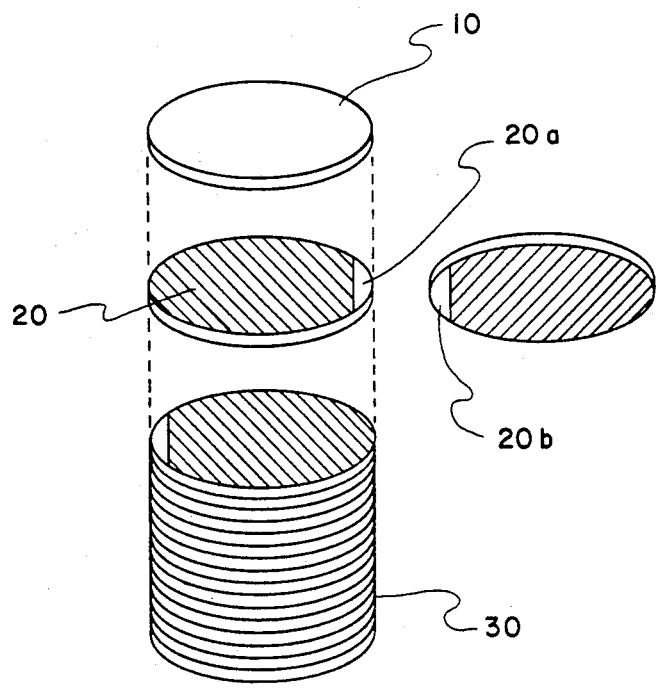
FIG. 11 is a perspective view of another structure of the electrostrictive element.
Figure 12:
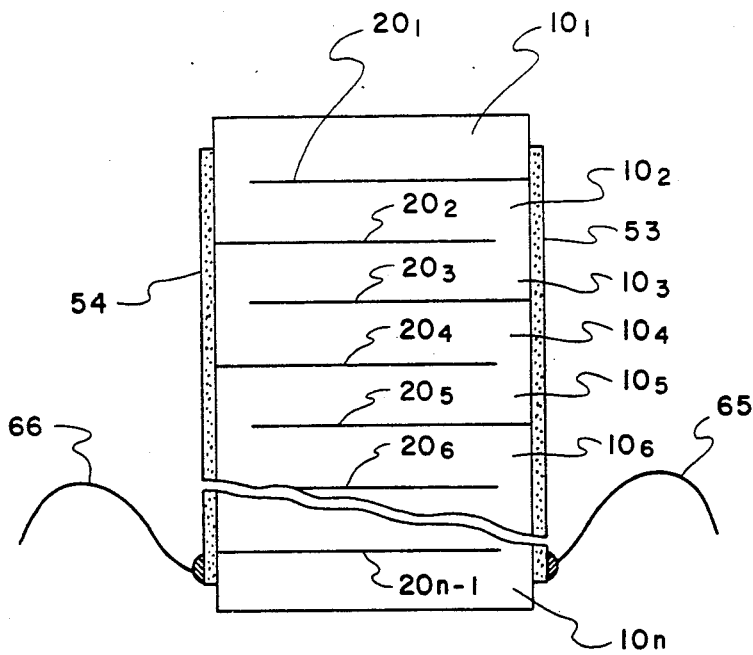
FIG. 12 is a vertical sectional view of the electrostrictive element shown in FIG. 11.

Referring to FIG. 11 and FIG. 12, shown structure is generally called stack type, and internal electrode conductors 20 are formed on both sides of the electrostricture ceramic members 10 sintered beforehand in dislike form by leaving a pair of marginal parts 20a and 20b so as to be symmetric with respect to the front and the rear faces. Then, as shown in FIG. 12, the marginal portions 20a and 20b where no internal electrode conductors are not exposed are alternately aligned respectively on both ends of the side surface, electrostrictive ceramic members $10_l$ to $10_n$ are connected with an adhesive or the like, and a pillarlike laminated body 30 is formed. Then, a pair of external electrode conductors 53 and 54 having a width smaller than that of the marginal portions 20a and 20b, whereby they are electrically connected alternately and respectively to the exposed portions of the internal electrode conductors $20_1$ to $20_n$. Finally, a stack type laminated electrostrictive element is obtained by installing lead wires 65 and 66 that are electrically connected to the external electrode conductors 53 and 54. Then, the manufacture is completed by hermetically sealing the element obtained with a metallic case and a metallic stem as in the fifth and the sixth embodiments.

Figure 7:
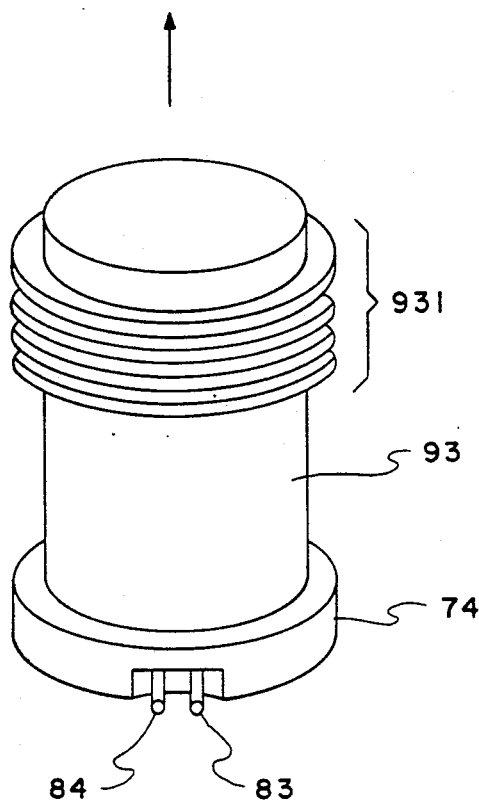
FIG. 7 is a perspective view showing a fifth embodiment of the present invention
Figure 8:
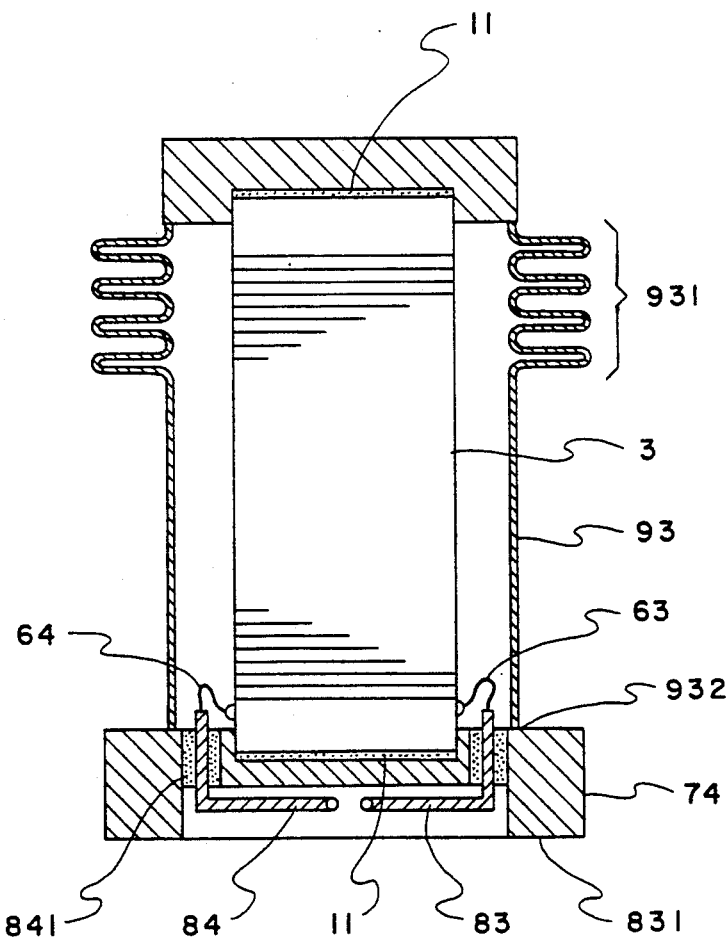
FIG. 8 is a vertical view of the fifth embodiment shown in FIG. 7.
Figure 9:
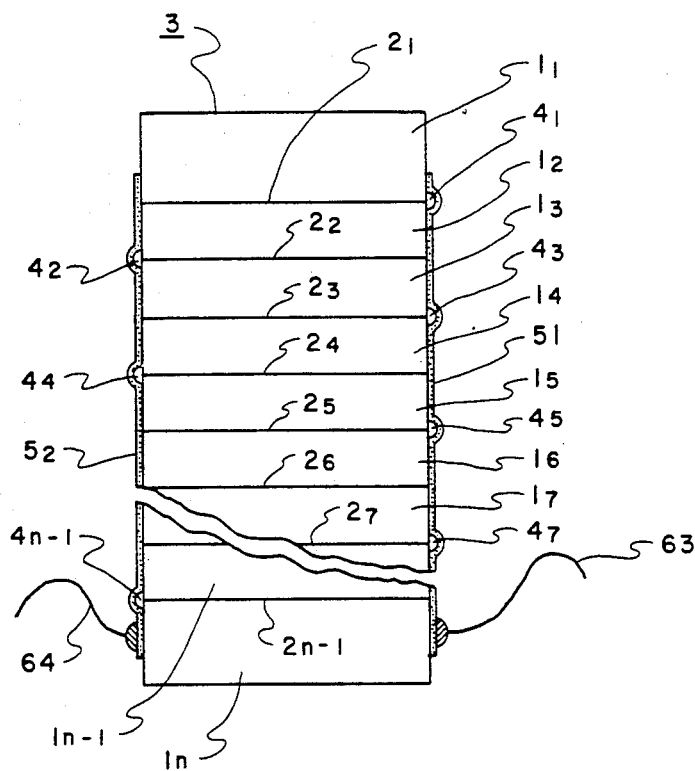
FIG. 9 is a vertical sectional view showing the details of the laminated piezoelectric element shown in FIG. 8.

In the electrostrictive elements shown in FIG. 7 to FIG. 12, when a voltage is applied to the external terminals 83 and 84 from a voltage supply part (not shown), the voltage is applied to both ends of each of the electrostrictive ceramic members $1_2$ to $1_{n-1}$ via the lead wires 63 and 64, external electrode conductors 51 and 52 and internal electrode conductors $2_1$ to $2_{n-1}$. Therefore, when the metallic stem 7 side is fixed, there are generated a stress and a strain in the direction of the arrow (FIG. 7).

Figure 13:
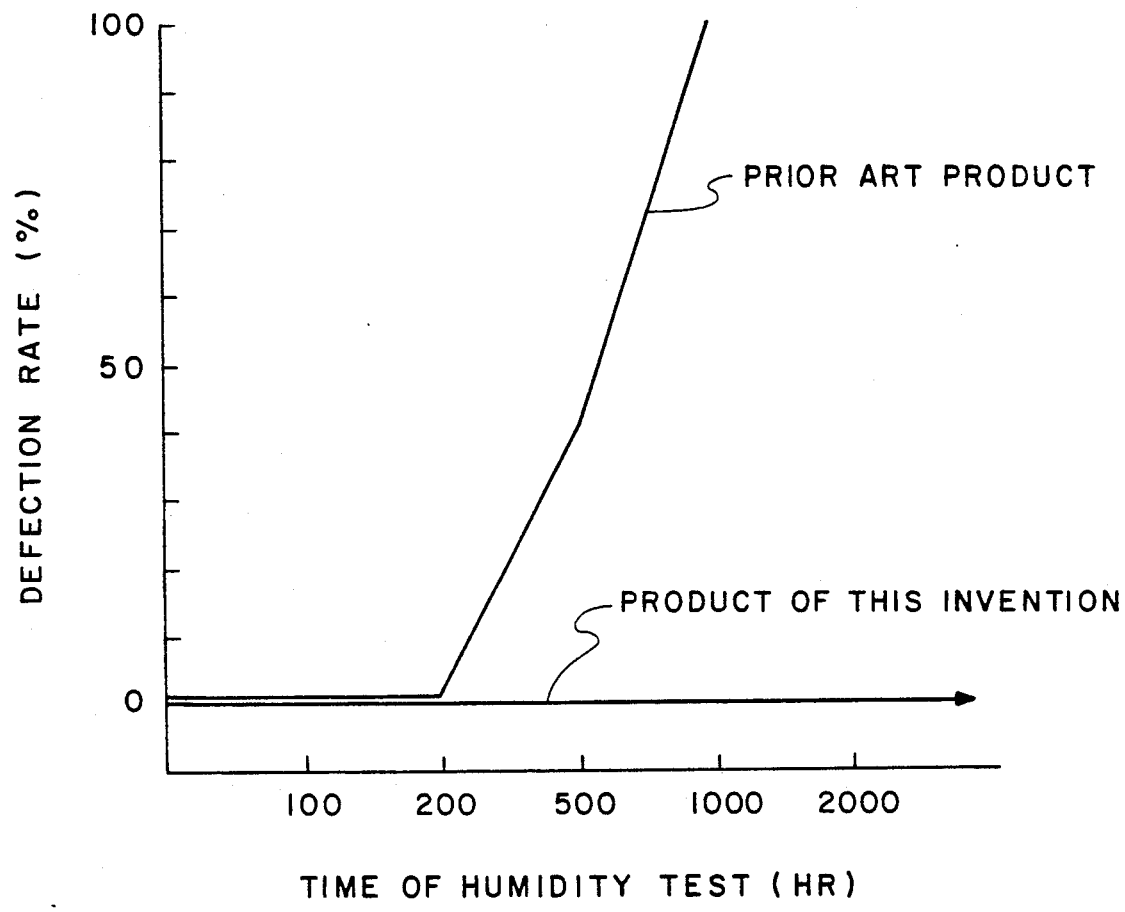
FIG. 13 is a characteristic curve showing the result of a humidity test.

FIG. 13 shows the result of evaluation of moisture resistance of the actuator by the application of a DC voltage. When 1000 samples of the fifth embodiment of the present invention are tested in an atmosphere at 65° C. with relative humidity of 90 to 95 % by applying a rated voltage, there observed no defective product, indicating a remarkable effect of the present invention.

As described in the above, the present invention has an effect of completely blocking the infiltration of the moisture, chemicals, oil, other gases and the like into the interior of the element by improving airtightness markedly by hermetically sealing the piezoelectric element with a flexible metallic case and a metallic stem. Further, there is obtained an effect that a highly reliable electrostrictive actuator which can absolutely reject the influence of the moisture, chemicals, oil, other gases and the like by markedly increasing the electric resistance of the surface of the element by hermetically sealing the sealing port of the metallic stem after replacing the gas inside the actuator.

Figure 14:
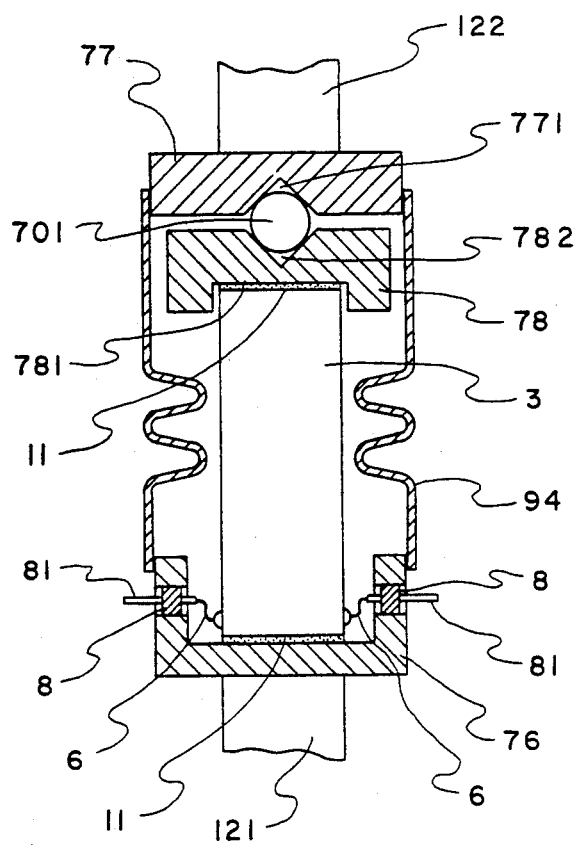
FIG. 14 is a vertical sectional view showing a seventh embodiment of the present invention.

Next, referring to FIG. 14, a seventh embodiment of the present invention will be described. The electrostrictive element 3 is formed by alternately laminating a piezoelectric ceramic member and an internal electrode conductor layer, and providing a pair of lead wires 6. One end of the electrostrictive element 3 is fixed to the bottom surface of a metallic cap 76. The side surface of the cap 76 is provided with a pair of glass sealing terminals 8. Each glass sealing terminal has a lead terminal connected to a respective lead wire 6 of the electrostrictive element 3. Further at the opening part of the metallic cap 76 there is welded along its entire circumference a stainless steel bellows 94 having inner diameter equal to the outer diameter of the metallic cap 76 and extending beyond the other end of the electrostrictive element 3. On the other end of the electrocstictive element 3, a metallic member 78 having a conical recess 782 at the center of one of the surfaces and a recess 781 with substantially equal inner diameter as the outer diameter of the electrostrictive element 3 on the other surface, is placed covering the end of element 3 with the recess 781. Further, a metallic member 77 with substantially equal size as the other diameter of the metallic cap 76 and having a conical recess 771 on one surface, faces the metallic member 78 via a steel ball 701 that is held between the recesses 782 and 771, and is welded along the entire circumference to the bellows 94 on the opening side of the bellows 94.

Next, the assembly of the electrostrictive element of the present invention will be described.

First, the lead wires 6 of the electrostrictive element 3 are connected by soldering to the respective lead terminals 81 of the metallic cap 76. Then, the electrostrictive element 3 is placed in the bellows 94 which is welded to the metallic cap 76, and the element 3 is fixed to the inner bottom surface of the metallic cap 76 with an adhesive so as to stand erect there. Next, the recess 781 of the metallic member 78 is fixed to the upper end part of the electrostrictive element 3, and the metallic member 77 is fixed to the opening part of the bellows 94 so as to hold the steel ball 701 between the conical recess 782 of the metallic member 78 and the conical recess 771 of the metallic member 77. Finally, the assembly is completed by welding the metallic member 77 and the bellows 94 along their entire circumferences. When the electrostrictive element 3 thus completed is attached between the mounting members 121 and 122 of the actuator, and a voltage is applied between the lead terminals 8, there is generated a desired displacement in the direction to separate the mounting members 121 and 122 by expansion.

As described in the above, the present embodiment is given a construction in which two metallic members are provided at one end of the electrostrictive element so as to hold a steel ball freely rollably between the opposing faces of the metallic members. Therefore, it becomes possible to establish a close contact between the respective end surfaces of the electrostrictive element and the mounting surfaces of the mounting members, without requiring a high accuracy finishing of both end surfaces of the electrostrictive element, both end surfaces of the upper and lower metallic members, and both end surfaces of the mounting members, and a high accuracy parallelism between both end surfaces of the mounting members. Since a desired displacement can be obtained with the above construction, the present embodiment has an effect to reduce the manufacturing cost markedly.

Figure 15:
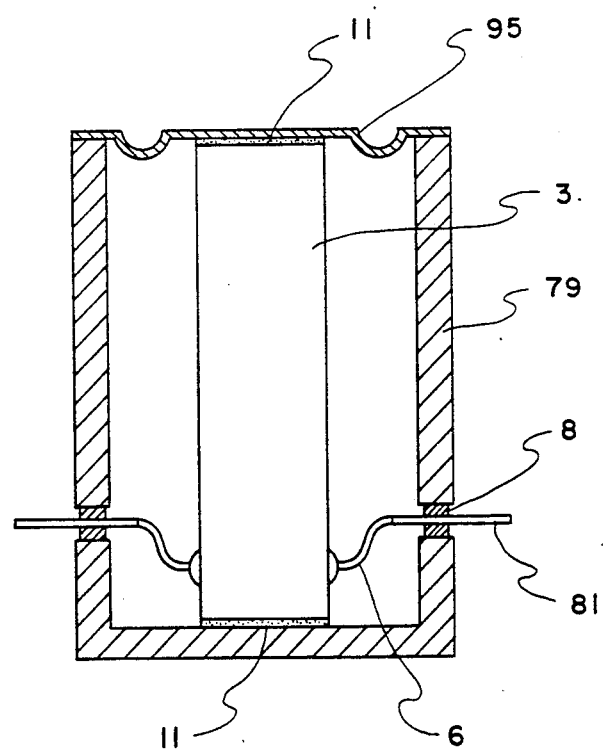
FIG. 15 is a vertical sectional view showing an eighth embodiment of the present invention.

FIG. 15 is a vertical sectional view of an eighth embodiment of the electrostrictive actuator of the present invention.

The electrostrictive element 3 is installed within a stainless steel cylindrical metallic member 79. The metallic member 79 is provided with a pair of glass sealing terminals 8. The other end of the electrostrictive element 3 and the opening end of the metallic member 79 are fixed with a stainless steel diaphragm 95 having outer diameter equal to the outer diameter of the metallic member 79.

Next, the assembly of the present embodiment will be described.

The electrostrictive element 3 manufactured according to a method similar to the conventional method is fixed with an adhesive to the inner bottom surface of the metallic member 79 so as to stand erect there. Next, the lead wires 6 of the electrostrictive element 3 and the inner ends of the lead terminals 81 attached to the metallic member 79 are respectively connected by soldering. Then, the diaphragm 95 is fixed to the top surface of the electrostrictive element 3 with an adhesive. Here, the spring constant of the diaphragm 95 in the direction of expansion and contraction is preferable to be one tenth of the generating force of the electrostrictive element 3. Finally, hermetic sealing is completed by welding the circumferential end of the diaphragm 95 to the entire circumference of the metallic member 79 by electric arc welding.

It is to be noted that the shape of the diaphragm 95 shown in the present embodiment has one crest, but needless to say it may have a plurality of crests or have an indefinitely shaped waveform.

As described in the above, the eigth embodiment has an effect of making it possible to manufacture products with high reliability that can withstand mechanical vibrations or shocks by enclosing the electrostrictive element in a container consisting of a diaphragm and a metallic member.

We claim:

1. A hermetically sealed electrostrictive actuator comprising: a metal case having an opening and a bottom, an electrostrictive element housed in said metal case and having a pair of lead wires, one end of said electrostrictive element being fixed to said bottom of said metal case, and a metal cap member fixed to the other end of said electrostrictive element, said metal cap member and said metal case being welded to seal said opening of said metal case in an airtight manner a pair of glass sealing terminals associated with said metal cap member so that said pair of lead wires are led out from a side wall portion of said metal cap member via said glass sealing terminals, and said metal case having a flexible region so as to follow the expansion and contraction of said electrostrictive element.

2. A hermetically sealed electrostrictive actuator as claimed in claim 1, wherein said flexible region is formed by corrugating a part of said metal case.

3. A hermetically sealed electrostrictive actuator as claimed in claim 1, wherein said metal case is divided into two portions such that, one is tubular member of bellows and the other is concave metal lid.

4. A hermetically sealed electrostrictive actuator as claimed in claim 3, wherein metal lid is divided into two portions so as to sandwich a steel ball therebetween.

5. A hermetically sealed electrostrictive actuator as claimed in claim 1, wherein said flexible region is formed at bottom portion so as to form a diaphragm.

6. A hermetically sealed electrostrictive actuator comprising: a metal case having an opening and a bottom, said opening having a flange, an electrostrictive element housed in said metal case, one end of said electrostrictive element being fixed to said bottom of said metal case, a first metal cap member fixed to the other end of said electrostrictive element, said first metal cap member having a flange which is welded in an airtight manner to said flange of said metal case, a pair of glass sealing terminals on said first metal cap, a second cap member covering said pair of glass sealing terminals, a pair of lead wires electrically connected through said pair of glass terminals to said electrostrictive element, said lead wires piercing a side wall of said second cap member, and said metal case having a plurality of corrugated portions which follow the expansion and contraction of said electrostrictive element.

7. A hermetically sealed electrostrictive actuator as claimed in claim 6, wherein said second cap member has a projection with a tapered part at its center.

* * * * *